(12) United States Patent
Webb, Jr.

(10) Patent No.: US 7,220,920 B1
(45) Date of Patent: May 22, 2007

(54) FLEXIBLE ELECTRICAL CIRCUIT WITH SLOTTED COVERLAY

(75) Inventor: Larry C. Webb, Jr., Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 503 days.

(21) Appl. No.: 10/763,617

(22) Filed: Jan. 23, 2004

(51) Int. Cl.
*H05K 1/00* (2006.01)

(52) U.S. Cl. .................................... 174/254; 360/245.9

(58) Field of Classification Search ................ 174/254, 174/117 F, 117 FF, 72 A; 360/245.9; 349/15, 349/150
See application file for complete search history.

(56) References Cited
U.S. PATENT DOCUMENTS

| | | | |
|---|---|---|---|
| 5,084,124 A | 1/1992 | Taniguchi | |
| 5,162,140 A | 11/1992 | Taniguchi | |
| 5,253,415 A * | 10/1993 | Dennis | 29/827 |
| 5,331,117 A | 7/1994 | Bryant et al. | |
| 5,473,118 A | 12/1995 | Fukutake et al. | |
| 5,493,074 A | 2/1996 | Murata et al. | |
| 5,583,320 A | 12/1996 | Eriguchi et al. | |
| 5,674,595 A | 10/1997 | Busacco et al. | |
| 5,903,440 A * | 5/1999 | Blazier et al. | 361/749 |
| 5,924,187 A * | 7/1999 | Matz | 29/603.03 |
| 6,308,406 B1 | 10/2001 | Gill et al. | |
| 6,344,308 B1 | 2/2002 | Kurita et al. | |
| 6,362,433 B1 | 3/2002 | Takahashi et al. | |
| 6,372,992 B1 | 4/2002 | Yang | |
| 6,395,993 B1 | 5/2002 | Nakumura et al. | |
| 6,420,659 B1 * | 7/2002 | Tsutsumi et al. | 174/254 |
| 6,822,168 B2 * | 11/2004 | Klesing et al. | 174/254 |
| 6,927,343 B2 * | 8/2005 | Watanabe et al. | 174/254 |
| 2002/0150742 A1 | 10/2002 | Ragland et al. | |

* cited by examiner

*Primary Examiner*—Ishwar (I. B.) Patel
(74) *Attorney, Agent, or Firm*—Faegre & Benson LLP

(57) ABSTRACT

An integrated lead flexure having a slotted coverlay to compensate for curling caused by thermal and hygroscopic-induced expansion and contraction of the coverlay.

12 Claims, 2 Drawing Sheets

FLEXIBLE ELECTRICAL CIRCUIT WITH SLOTTED COVERLAY

FIELD OF THE INVENTION

The present invention relates generally to flexible electrical circuits. In particular, the invention is a flexible electrical circuit having a slotted or siped coverlay.

BACKGROUND OF THE INVENTION

A wide variety of flexible electrical circuits (also sometimes known as flex circuits) are well known and used in many different applications. The structure of a relatively simple flexible circuit has one or more electrical leads or traces (e.g., formed of copper or other conductive metal) covered on one or both sides by a protective coverlay (also sometimes referred to a coverlayer or a cover coat). The coverlay is typically a dielectric material such as polyimide. A more complex flexible circuit structure of this type has a dielectric base layer on one side of the electrical leads or traces, and a coverlay on the other side. Still other known flexible circuits have a dielectric base layer without a coverlay.

Integrated lead or wireless suspensions used to support read/write transducers in disk drives or other dynamic data storage systems are another type of flexible circuit. These devices typically have a stainless steel or other spring metal layer for supporting the electrical traces. A layer of dielectric insulating material separates the traces from the stainless steel. A protective dielectric coverlay is commonly applied over the traces.

Unfortunately, due to the differences in the thermal and hygroscopic expansion properties of the different layers of material in a flexible circuit, the circuits are susceptible to curl. For example, when the coverlay material is cured during its application to the flexible circuit, or when the coverlay is cooled or dried after application to the flexible circuit, the length of the coverlay can decrease more than the conductor layer, and cause the flexible circuit to curl toward the coverlay. Conversely, if the coverlay is heated or hydrated, its length can increase more than the conductor layer, and cause the flexible circuit to curl away from the coverlay. This curling can interfere with mechanical or other characteristics of the flexible circuit or other structures to which the flexible circuit is mounted. In the case of integrated lead suspensions in particular, this curl can cause changes in important operational parameters such as the static attitude and gram load of the suspension. There is, therefore, a need for integrated lead suspensions and other flexible circuits having reduced susceptibility to curl. To be commercially viable, any such flexible circuit should be efficient to manufacture.

SUMMARY OF THE INVENTION

The present invention is a flexible circuit having a slotted or siped coverlay that reduces the susceptibility of the flexible circuit to thermal and hygroscopic-induced curling. This curling-compensated flexible circuit can be efficiently manufactured.

One embodiment of the invention includes one or more electrically conductive traces, and a dielectric layer on a surface of at least one of the traces. The dielectric layer is susceptible to thermal and/or hygroscopic-induced expansion and contraction. Slots in the dielectric layer are oriented non-parallel to a longitudinal axis of the conductive traces, and reduce curling caused by the thermal and/or hygroscopic-induced expansion and contraction of the dielectric layer.

A preferred embodiment of the invention is an integrated lead suspension having a plurality of traces. The slots can be perpendicular to the longitudinal axis of the traces and parallel to one another.

DETAILED DESCRIPTION OF THE PREFERRED EMBODIMENTS

Figure 1:
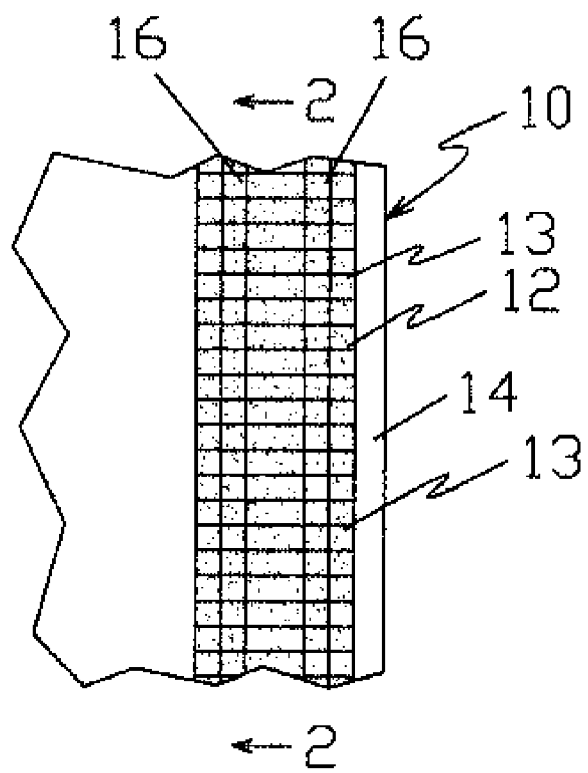
FIG. 1 is an illustration of a portion of an integrated lead or wireless flexure having a slotted coverlay in accordance with a first embodiment of the present invention.
Figure 2:
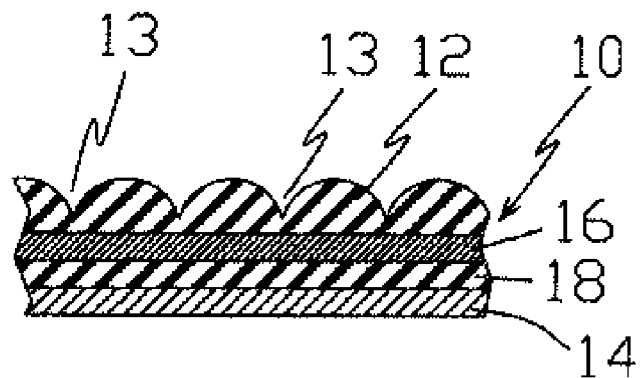
FIG. 2 is a cross sectional illustration of the flexure shown in FIG. 1, taken along lines 2—2.

FIGS. 1 and 2 are illustrations of a portion of an integrated lead suspension or flexure 10 having a siped coverlay 12 with slots 13 in accordance with a first embodiment of the invention. As shown, the flexure 10 also includes a stainless steel or other spring metal layer 14, electrical leads or traces 16 formed from a conductor layer (e.g., copper alloy), and a layer 18 of dielectric (i.e., an insulator) between the stainless steel and traces. In the embodiment shown, the coverlay 12 extends over the group of adjacent traces 16, the space between the adjacent traces, and a short distance beyond the group of traces. In other embodiments (not shown), the coverlay 12 can extend over greater or lesser portions of the flexure 10. With the exception of the slots 13, flexure 10 can be of any known or otherwise conventional design. Photolithographic etching or other known or conventional processes can be used to manufacture the flexure 10, including the coverlay 12 and slots 13.

Slots 13 are oriented in a non-parallel direction with respect to the direction of the curl that is desired to be compensated by the invention. In the illustrated embodiment of flexure 10, thermal and hygroscopic expansion of the coverlay 12 would tend to cause curl in a direction parallel to the traces 16. Accordingly, the slots 13 are oriented in a non-parallel direction with respect to the longitudinal axis of the traces 16. Although not necessary to achieve the desirable results of the invention, in the preferred embodiment shown in FIGS. 1 and 2, the slots 13 are perpendicular to the longitudinal axis of the traces 16.

Figure 3:
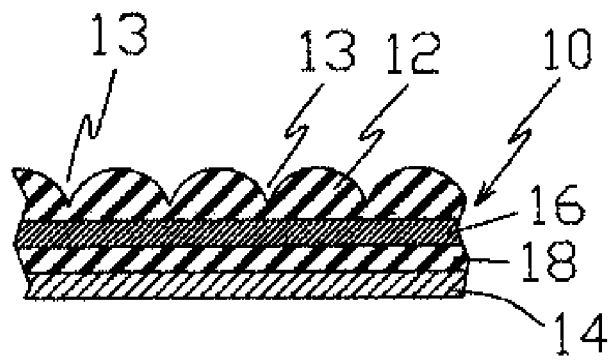
FIG. 3 is a cross sectional illustration of a portion of an integrated lead flexure having a slotted coverlay in accordance with a second embodiment of the invention.
Figure 4:
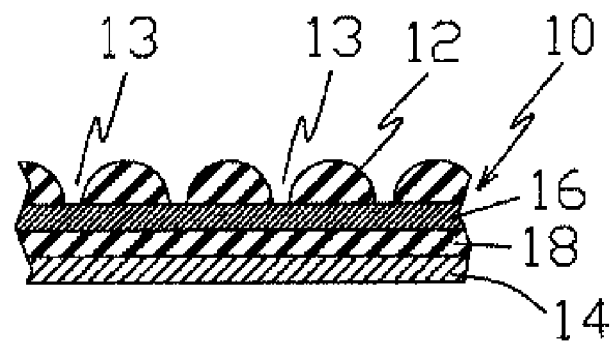
FIG. 4 is a cross sectional illustration of a portion of an integrated lead flexure having a slotted coverlay in accordance with a third embodiment of the invention.
Figure 5:
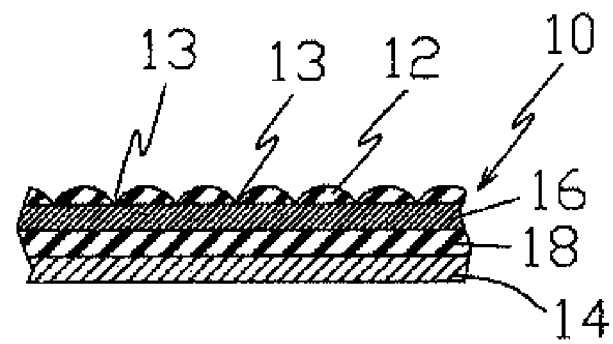
FIG. 5 is a cross sectional illustration of a portion of an integrated lead flexure having a slotted coverlay in accordance with a fourth embodiment of the invention.

The depth and distance between the slots (pitch) can depend on a number of factors such as the thickness of the coverlay 12, the thermal and hygroscopic characteristics of the coverlay, the values and ranges of temperatures and humidity to which the flexure 10 will be exposed and the amount of curl that is desired to be compensated for (i.e., reduced). In one embodiment of flexure 10, the pitch is about 100 µm. The range of the pitch can be between about 25 µm and 200 µm, but pitches outside this range are also contemplated by the invention. In the embodiment illustrated in FIGS. 1 and 2, the slots 13 do not extend completely through the coverlay 12. However, slots 13 of other depths are also contemplated by the invention. By way of example, flexures 10', 10" and 10''' shown in FIGS. 3–5, respectively, illustrate siped coverlays 12', 12" and 12''' having a slots 13', 13" and 13''' of different depths and pitches. The depth and pitch of the slots 13 can also vary, although they are constant in the illustrated embodiments. Similarly, although the slots 13 are parallel to one another in the illustrated embodiments, the slots can also be non-parallel.

Although the invention has been described with reference to preferred embodiments, those skilled in the art will recognize that changes can be made in form and detail without departing from the spirit and scope of the invention. For example, although described in connection with an integrated lead flexure, the siped coverlay can be used in connection with other flexible circuits, such as on a single side of a conductor, on two sides of a conductor, and on a conductor backed only by a dielectric base layer. Furthermore, although the siping has been described as being in a coverlay, siping in accordance with the invention can be incorporated into other dielectric layers such as a polyimide base layer.

What is claimed is:

1. An integrated lead flexure, including:
   a base layer;
   a plurality of elongated electrical traces on the base layer;
   a dielectric coverlay over at least portions of the traces; and
   slots in at least portions of the coverlay oriented non-parallel to a longitudinal axis of the traces.

2. The integrated lead flexure of claim 1 wherein the slots extend only partially through the coverlay.

3. The integrated lead flexure of claim 1 wherein the slots extend through the coverlay.

4. The integrated lead flexure of claim 1 wherein the slots have a constant depth.

5. The integrated lead flexure of claim 1 wherein the slots have a constant pitch.

6. The integrated lead flexure of claim 1 wherein the slots are generally parallel to one another.

7. An integrated lead flexure, including:
   a stainless steel layer;
   a plurality of elongated electrical traces over the stainless steel layer;
   a dielectric insulating layer between the stainless steel layer and the electrical traces;
   a dielectric coverlay over at least portions of the traces; and
   slots in at least portions of the coverlay oriented non-parallel to a longitudinal axis of the traces.

8. The integrated lead flexure of claim 7 wherein the slots extend only partially through the coverlay.

9. The integrated lead flexure of claim 7 wherein the slots extend through the coverlay.

10. The integrated lead flexure of claim 7 wherein the slots have a constant depth.

11. The integrated lead flexure of claim 7 wherein the slots have a constant pitch.

12. The integrated lead flexure of claim 7 wherein the slots are generally parallel to one another.

* * * * *